US 12,142,503 B2

(12) United States Patent
Kopec et al.

(10) Patent No.: US 12,142,503 B2
(45) Date of Patent: *Nov. 12, 2024

(54) SENSOR-BASED CORRECTION OF ROBOT-HELD OBJECT

(71) Applicant: Applied Materials, Inc., Santa Clara, CA (US)

(72) Inventors: Nicholas Michael Kopec, Santa Clara, CA (US); Damon K. Cox, Jarrell, TX (US); Leon Volfovski, Mountain View, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/127,278

(22) Filed: Mar. 28, 2023

(65) Prior Publication Data

US 2023/0307273 A1 Sep. 28, 2023

Related U.S. Application Data

(63) Continuation of application No. 16/452,091, filed on Jun. 25, 2019, now Pat. No. 11,626,305.

(51) Int. Cl.
*B25J 9/16* (2006.01)
*G06T 1/00* (2006.01)
(Continued)

(52) U.S. Cl.
CPC ...... *H01L 21/67265* (2013.01); *B25J 9/1679* (2013.01); *G06T 1/0014* (2013.01);
(Continued)

(58) Field of Classification Search
USPC .................................. 700/245–264
See application file for complete search history.

(56) References Cited

U.S. PATENT DOCUMENTS 5,381,004 A * 1/1995 Uritsky ................. H01J 37/256
250/307
6,114,705 A * 9/2000 Leavitt ..................... G21K 5/10
250/442.11
(Continued)

FOREIGN PATENT DOCUMENTS

CN 103733325 B 12/2016
CN 107107336 B 4/2021
(Continued)

OTHER PUBLICATIONS

International Search Report and Written Opinion of International application No. PCT/US2020/039415 dated Oct. 16, 2020, 14 pages.

*Primary Examiner* — Jonathan L Sample
(74) *Attorney, Agent, or Firm* — Lowenstein Sandler LLP

(57) ABSTRACT

A robotic object handling system comprises a robot arm, an image sensor, a first station, and a computing device. The computing device is to cause the robot arm to pick up an object on an end effector, cause the image sensor to generate sensor data of the object, determine at least one of (i) a rotational error of the object or (ii) a positional error of the object based on the sensor data, cause an adjustment to the robot arm to approximately remove at least one of the rotational error or the positional error, and cause the robot arm to place the object at the first station without at least one of the rotational error or the positional error.

23 Claims, 7 Drawing Sheets

(51) Int. Cl.
  *H01L 21/67* (2006.01)
  *H01L 21/677* (2006.01)
(52) U.S. Cl.
  CPC .. *H01L 21/67196* (2013.01); *H01L 21/67201* (2013.01); *H01L 21/67742* (2013.01)

(56) References Cited

U.S. PATENT DOCUMENTS

| | | | |
|---|---|---|---|
| 6,748,293 B1* | 6/2004 | Larsen | H01L 21/681 414/811 |
| 7,792,350 B2 | 9/2010 | Kiley et al. | |
| 8,397,739 B2 | 3/2013 | Gregor et al. | |
| 8,784,033 B2 | 7/2014 | Kremerman et al. | |
| 9,026,244 B1 | 5/2015 | Mazzocco et al. | |
| 9,457,464 B2 | 10/2016 | Kremerman et al. | |
| 9,579,788 B2 | 2/2017 | Rosenberg et al. | |
| 9,881,820 B2 | 1/2018 | Wong et al. | |
| 9,947,517 B1 | 4/2018 | Luere et al. | |
| 9,966,290 B2* | 5/2018 | Senn | H01L 21/682 |
| 10,014,198 B2 | 7/2018 | Richardson | |
| 10,041,868 B2 | 8/2018 | Gottscho | |
| 10,062,589 B2 | 8/2018 | Wong et al. | |
| 10,062,590 B2 | 8/2018 | Wong et al. | |
| 10,062,599 B2 | 8/2018 | Genetti et al. | |
| 10,103,010 B2 | 10/2018 | Luere et al. | |
| 10,124,492 B2 | 11/2018 | Genetti et al. | |
| 10,541,168 B2 | 1/2020 | Tan et al. | |
| 10,978,330 B2* | 4/2021 | Yin | H01L 21/68 |
| 11,626,305 B2* | 4/2023 | Kopec | H01L 21/67201 700/254 |
| 2002/0089655 A1* | 7/2002 | Kida | H01L 21/68707 355/72 |
| 2003/0231950 A1* | 12/2003 | Raaijmakers | H01L 21/681 414/935 |
| 2004/0031779 A1* | 2/2004 | Cahill | B23K 26/0853 257/E23.179 |
| 2004/0075822 A1* | 4/2004 | Hattori | H01L 21/67778 355/72 |
| 2005/0238975 A1 | 10/2005 | Fujiki et al. | |
| 2007/0189596 A1* | 8/2007 | Lee | G06T 7/33 382/151 |
| 2008/0013089 A1* | 1/2008 | Ishii | G03F 9/7011 356/400 |
| 2009/0279989 A1* | 11/2009 | Wong | H01L 21/68 414/217 |
| 2010/0279439 A1* | 11/2010 | Shah | H01L 21/67259 348/95 |
| 2010/0296070 A1* | 11/2010 | Shibazaki | G03F 7/707 355/53 |
| 2011/0050882 A1* | 3/2011 | Lee | G06V 10/242 348/95 |
| 2011/0085150 A1* | 4/2011 | Ichinose | G03F 7/7075 355/77 |
| 2011/0123913 A1* | 5/2011 | Yoshimoto | G03F 7/70775 430/30 |
| 2013/0183623 A1* | 7/2013 | Shibazaki | G03F 7/20 430/296 |
| 2013/0325179 A1* | 12/2013 | Liao | B25J 9/1697 700/254 |
| 2014/0107825 A1* | 4/2014 | Kubodera | H01L 21/67766 700/112 |
| 2016/0211165 A1 | 7/2016 | McChesney et al. | |
| 2016/0211166 A1 | 7/2016 | Yan et al. | |
| 2016/0216185 A1 | 7/2016 | Gottscho | |
| 2017/0028560 A1* | 2/2017 | Senn | H01L 21/682 |
| 2017/0053819 A1 | 2/2017 | Richardson | |
| 2017/0113355 A1 | 4/2017 | Genetti et al. | |
| 2017/0115657 A1 | 4/2017 | Trussell et al. | |
| 2017/0117172 A1 | 4/2017 | Genetti et al. | |
| 2017/0119339 A1 | 5/2017 | Johnson et al. | |
| 2017/0133283 A1 | 5/2017 | Kenworthy | |
| 2017/0213758 A1 | 7/2017 | Rice et al. | |
| 2017/0236688 A1 | 8/2017 | Caron et al. | |
| 2017/0236741 A1 | 8/2017 | Angelov et al. | |
| 2017/0236743 A1 | 8/2017 | Severson et al. | |
| 2017/0263478 A1 | 9/2017 | McChesney et al. | |
| 2017/0287682 A1 | 10/2017 | Musselman et al. | |
| 2017/0287753 A1 | 10/2017 | Musselman et al. | |
| 2017/0330786 A1 | 11/2017 | Genetti et al. | |
| 2017/0330876 A1* | 11/2017 | Leedy | G02B 6/12002 |
| 2017/0334074 A1* | 11/2017 | Genetti | H01L 21/6719 |
| 2018/0008995 A1* | 1/2018 | Baker | H10K 71/00 |
| 2018/0019107 A1 | 1/2018 | Ishizawa | |
| 2018/0019142 A1 | 1/2018 | Wong et al. | |
| 2018/0032062 A1 | 2/2018 | Trussell et al. | |
| 2018/0040492 A1 | 2/2018 | Wong et al. | |
| 2018/0068879 A1 | 3/2018 | Wong et al. | |
| 2018/0090354 A1 | 3/2018 | Sugita et al. | |
| 2018/0101104 A1* | 4/2018 | Shibazaki | G03F 7/70758 |
| 2018/0166259 A1 | 6/2018 | Ueda | |
| 2018/0218933 A1 | 8/2018 | Luere et al. | |
| 2018/0233328 A1 | 8/2018 | Ueda et al. | |
| 2018/0277416 A1 | 9/2018 | Takahashi et al. | |
| 2018/0301322 A1 | 10/2018 | Sugita et al. | |
| 2018/0315583 A1 | 11/2018 | Luere et al. | |
| 2018/0315640 A1 | 11/2018 | Ueda et al. | |
| 2018/0341187 A1* | 11/2018 | Shibazaki | G03F 7/70725 |
| 2020/0013657 A1* | 1/2020 | Lee | H01L 21/67242 |

FOREIGN PATENT DOCUMENTS

| | | |
|---|---|---|
| KR | 20050054859 A | 6/2005 |
| WO | 2004019135 A1 | 3/2004 |
| WO | WO-2015179194 A1 * | 11/2015 ......... B25J 15/0014 |

\* cited by examiner

SENSOR-BASED CORRECTION OF ROBOT-HELD OBJECT

RELATED APPLICATIONS

The present application is a continuation of application Ser. No. 16/452,091, filed Jun. 25, 2019 the contents of which are incorporated by reference herein.

TECHNICAL FIELD

Embodiments of the present disclosure relate to detection and correction of misalignment (e.g., rotational misalignment) of objects picked up by a robot arm.

BACKGROUND

In semiconductor processing and other electronics processing, platforms are often used that use robotic arms to transport objects such as wafers between process chambers, from storage areas (e.g., front opening unified pods (FOUPs)) to process chambers, from process chambers to storage areas, and so on. In many instances, the objects are out of alignment when they are picked up by an end effector of a robot arm. The objects may include a rotational error and/or a positional error when they are picked up by an end effector. Traditionally, such misalignment is corrected by placing the objects into an aligner station that rotates the object until it has a correct alignment. The robot arm then picks the aligned object back up off of the aligner station before moving it to its destination. The use of an aligner station to correct the alignment of objects increases an amount of time that is used to transfer the object between a starting location and a destination and adds an additional handoff (between the aligner station and the robot arm) that can introduce additional error. Additionally, the aligner station consumes valuable real estate in the platform and in the fabrication facility at which the platform is located and adds additional cost to the platform. Moreover, for some objects a design of the end effector, an adapter for the end effector and/or the object itself is made to accommodate the aligner station. However, by designing these components to accommodate the aligner station, the end effector, adapter and/or object design may be less effective for other purposes.

SUMMARY

Some of the embodiments described herein cover a method of aligning an object. The method may include picking up the object on an end effector of a robot arm. The object may then be positioned within a detection area of a non-contact sensor using the robot arm. Sensor data may be generated of the object using the non-contact sensor while the object is held on the end effector of the robot arm. At least one of a rotational error of the object relative to a target orientation or a positional error of the object relative to a target position may then be determined based on the sensor data. The robot arm may be adjusted to approximately remove at least one of the rotational error or the positional error from the object. The object may then be placed at a first station using the robot arm, wherein the placed object lacks at least one of the rotational error or the positional error.

In some embodiments, a robotic object handling system comprises a robot arm comprising an end effector, a non-contact sensor having a detection area that is within a reach of the robot arm, a first station that is within the reach of the robot arm, and a computing device operatively coupled to the non-contact sensor and the robot arm. The computing device may execute instructions to cause the robot arm to pick up an object on the end effector. The computing device may further cause the robot arm to position the object within the detection area of the non-contact sensor. The computing device may further cause the non-contact sensor to generate sensor data of the object while the object is held on the end effector of the robot arm. The computing device may further determine at least one of a rotational error of the object relative to a target orientation or a positional error of the object relative to a target position based on the sensor data. The computing device may further cause an adjustment to the robot arm to approximately remove at least one of the rotational error or the positional error from the object. The computing device may further cause the robot arm to place the object at the first station, wherein the placed object lacks at least one of the rotational error or the positional error.

In some embodiments, a robotic handling system includes a robot arm comprising an end effector, a first station that is within reach of the robot arm, a second station that is within reach of the robot arm, a non-contact sensor having a detection area that is in the first station, and a computing device operatively coupled to the non-contact sensor and the robot arm. The computing device may execute instructions to cause the non-contact sensor to generate sensor data of the object while the object is at the first station. The computing device may further determine a rotational error of the object relative to a target orientation based on the sensor data. The computing device may further determine an angle correction for the object that will approximately remove the rotational error of the object. The computing device may further perform the following one or more times until the angle correction is achieved for the object: cause the robot arm to pick up the object from the first station; reposition the end effector; cause the robot arm to place the object back down on the first station using the repositioned end effector, the object having a reduced rotational error; and again reposition the end effector. The computing device may further cause the robot arm to again pick up the object from the first station. The computing device may further cause the robot arm to place the object at the second station, wherein the object placed at the second station lacks the rotational error.

BRIEF DESCRIPTION OF THE DRAWINGS

The present disclosure is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

DETAILED DESCRIPTION OF EMBODIMENTS

Embodiments described herein are related to systems and methods for detecting misalignment of objects picked up and/or held by robot arms and for correcting such misalignment. In particular, embodiments enable a misalignment of an object picked up by a robot arm to be corrected without use of an aligner station. In some embodiments, the misalignment of the object is correctable while the object is held by the robot arm. In other embodiments, the misalignment of the object is correctable by repeatedly picking up and replacing the object at a station that lacks components for realigning the object (e.g., a passive station).

In some embodiments, a non-contact sensor such as a camera is used along with image processing techniques to determine the misalignment of the object and to determine a rotational correction (e.g., a yaw correction) that will eliminate the misalignment. In an example, the object may be a process kit ring to be inserted into a process chamber, and the camera may generate an image of the process kit ring held on an end effector of a robot arm. The image may be processed to determine a rotational error and/or positional error of the process kit ring, and the robot arm may be adjusted (e.g., by rotating the end effector about an end effector axis and/or repositioning the end effector in a plane) to remove the rotational error of the process kit ring and/or positional error of the process kit ring. The robot arm may then place the process kit ring at a station (e.g., a transfer station) with the adjustment that removed the rotational error and/or the positional error.

Use of the non-contact sensor (e.g., an image sensor) and image processing to determine and correct for object misalignment of an object held on an end effector of a robot arm may enable an aligner station to be eliminated from a processing system. This may reduce a total cost of the processing system and may free up additional space for other purposes. Additionally, by eliminating the aligner station, a number of handoffs performed to transfer an object from its starting location to its destination may be reduced, which may increase an accuracy of the placement of the object at its target location (e.g., in a process chamber) and may reduce an amount of time to transfer the object from its starting location to its target location. Additionally, by eliminating the aligner station, design constraints imposed by the aligner station may be eliminated, improving an overall design of a carrier for the object.

Figure 1:
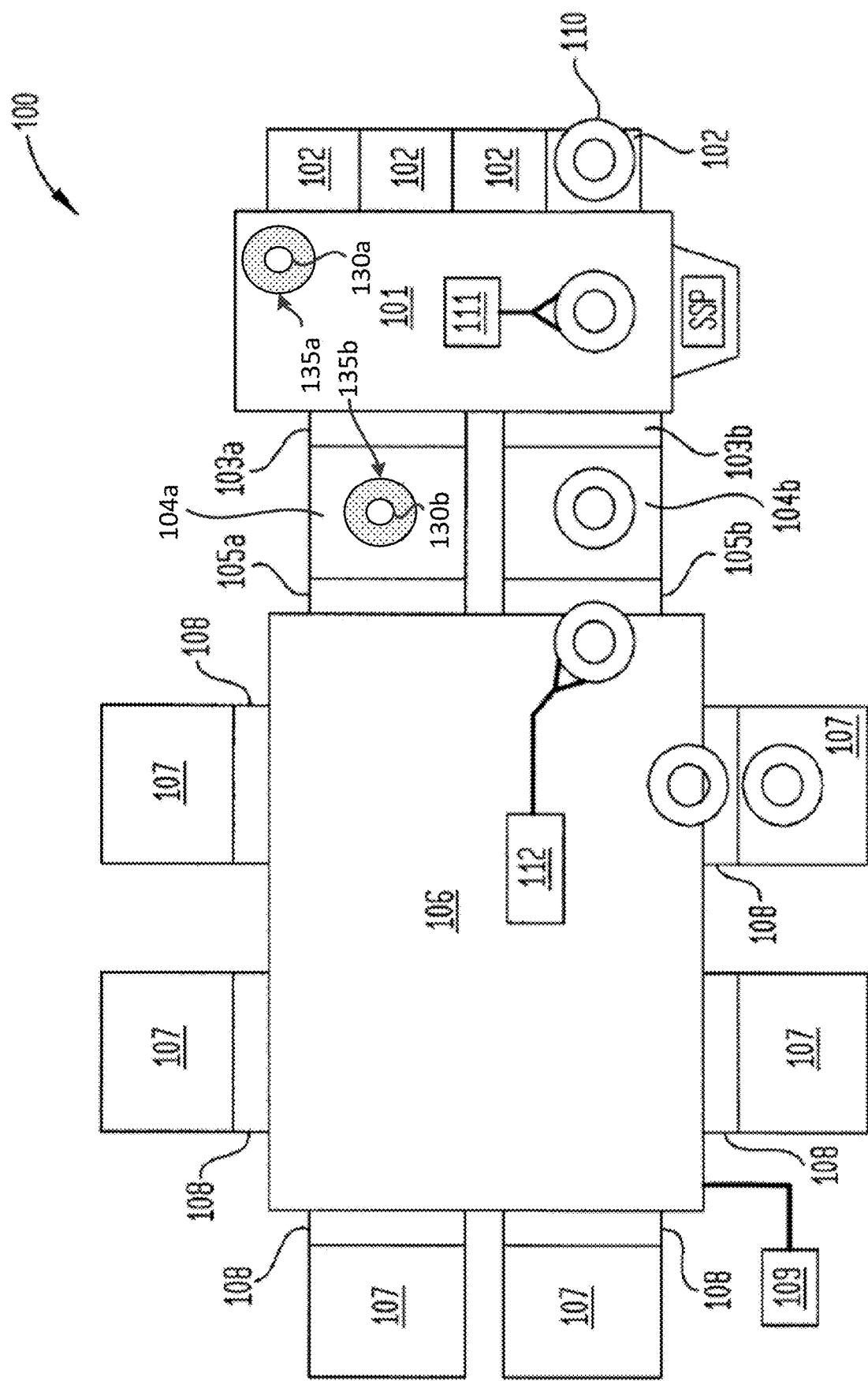
FIG. 1 illustrates a simplified top view of an example processing system, according to one aspect of the disclosure.

FIG. 1 illustrates an example processing system 100, according to one aspect of the disclosure. The processing system 100 includes a factory interface 101 to which a plurality of substrate cassettes 102 (e.g., FOUPs) may be coupled for transferring substrates (e.g., wafers such as silicon wafers) into the processing system 100. The processing system 100 may also include first vacuum ports 103a, 103b that may couple the factory interface 101 to respective stations 104a, 104b, which may be, for example, degassing chambers and/or load locks. Second vacuum ports 105a, 105b may be coupled to respective stations 104a, 104b and disposed between the stations 104a, 104b and a transfer chamber 106 to facilitate transfer of substrates into the transfer chamber 106. The transfer chamber 106 includes a plurality of processing chambers (also referred to as process chambers) 107 disposed therearound and coupled thereto. The processing chambers 107 are coupled to the transfer chamber 106 through respective ports 108, such as slit valves or the like.

The processing chambers 107 may include or more of etch chambers, deposition chambers (including atomic layer deposition, chemical vapor deposition, physical vapor deposition, or plasma enhanced versions thereof), anneal chambers, and the like. Some of the processing chambers 107, such as etch chambers, may include edge rings (also referred to as process kit rings) therein, which occasionally undergo replacement. While replacement of process kit rings in conventional systems includes disassembly of a processing chamber by an operator to replace the process kit ring, the processing system 100 is configured to facilitate replacement of process kit rings without disassembly of a processing chamber 107 by an operator.

Factory interface 101 includes a factory interface robot 111. Factory interface robot 111 may include a robot arm, and may be or include a selective compliance assembly robot arm (SCARA) robot, such as a 2 link SCARA robot, a 3 link SCARA robot, a 4 link SCARA robot, and so on. The factory interface robot 111 may include an end effector on an end of the robot arm. The end effector may be configured to pick up and handle specific objects, such as wafers. Alternatively, the end effector may be configured to handle objects such as process kit rings (edge rings). The factory interface robot 111 may be configured to transfer objects between cassettes 102 (e.g., FOUPs) and stations 104a, 104b.

Transfer chamber 106 includes a transfer chamber robot 112. Transfer chamber robot 112 may include a robot arm with an end effector at an end of the robot arm. The end effector may be configured to handle particular objects, such as wafers. The transfer chamber robot 112 may be a SCARA robot, but may have fewer links and/or fewer degrees of freedom than the factory interface robot 111 in some embodiments.

In one embodiment, factory interface 101 includes a non-contact sensor 130a. Non-contact sensor 130a may be an image sensor such as a camera. For example, non-contact sensor 130a may be or include a charge-coupled device (CCD) camera and/or a complementary metal oxide (CMOS) camera. Alternatively, non-contact sensor 130a may include an x-ray emitter (e.g., an x-ray laser) and an x-ray detector. Non-contact sensor 130a may alternatively be or include one or more pairs of a laser emitter that generates a laser beam and a laser receiver that receives the laser beam. A sensor measurement may be generated by a pair of a laser emitter and a laser receiver when the laser beam is interrupted such that the laser receiver does not receive the laser beam. Such information may be used together with accurate information on the position of the robot arm to generate sensor data, which may be an array of measurements, wherein each measurement corresponds to a different rotation of the end effector on factory interface robot 111 and/or a different position of the factory interface robot 111. Non-contact sensor 130a has a detection area 135a that is within a reach of a robot arm of the factory interface robot 111.

In one embodiment, station 104a and/or station 104b includes a non-contact sensor 130b. Non-contact sensor 130b may correspond to any of non-contact sensors 130a listed above in embodiments. Non-contact sensor 130*b* has a detection area 135*a* that is within station 104*a* and that that is further within a reach of a robot arm of the transfer chamber robot 112.

A controller 109 controls various aspects of the processing system 100. The controller 109 may be and/or include a computing device such as a personal computer, a server computer, a programmable logic controller (PLC), a microcontroller, and so on. The controller 109 may include one or more processing devices, which may be general-purpose processing devices such as a microprocessor, central processing unit, or the like. More particularly, the processing device may be a complex instruction set computing (CISC) microprocessor, reduced instruction set computing (RISC) microprocessor, very long instruction word (VLIW) microprocessor, or a processor implementing other instruction sets or processors implementing a combination of instruction sets. The processing device may also be one or more special-purpose processing devices such as an application specific integrated circuit (ASIC), a field programmable gate array (FPGA), a digital signal processor (DSP), network processor, or the like. The controller 109 may include a data storage device (e.g., one or more disk drives and/or solid state drives), a main memory, a static memory, a network interface, and/or other components. The controller 109 may execute instructions to perform any one or more of the methodologies and/or embodiments described herein. The instructions may be stored on a computer readable storage medium, which may include the main memory, static memory, secondary storage and/or processing device (during execution of the instructions).

The controller 109 may receive signals from and send controls to factory interface robot 111, wafer transfer chamber robot 112, non-contact sensor 130*a* and/or non-contact sensor 130*b* in embodiments.

FIG. 1 schematically illustrates transfer of an edge ring (or other process kit ring) 110 into a processing chamber 107. According to one aspect of the disclosure, an edge ring 110 is removed from a cassette 102 (e.g., a FOUP) via factory interface robot 111 located in the factory interface 101, or alternatively, is loaded directly into the factory interface 101. Edge rings are discussed herein, but it should be understood that embodiments described with reference to edge rings also apply to other process kit rings and to other objects other than rings.

In one embodiment, the factory interface robot 111 positions the edge ring 110 within the detection area 135*a* of non-contact sensor 130*a* (e.g., beneath non-contact sensor 130*a*). The non-contact sensor 130*a* generates sensor data of the edge ring 110 (e.g., generates a picture of the edge ring). Controller 109 receives the sensor data and analyzes the sensor data (e.g., performs image processing on a received image of the edge ring 110) to determine a rotational error of the edge ring 110 relative to a target orientation of the edge ring 110. For example, the edge ring may include a flat, notch or other registration feature, and the registration feature may have a target orientation relative to the end effector of the factory interface robot 111. Controller 109 may determine a rotational error, which may be a rotational angle between the target orientation and a current orientation of the edge ring 110. The controller 109 may send instructions to the factory interface robot 111 to cause the factory interface robot 111 to rotate the end effector (and edge ring 110 supported on the end effector) a prescribed amount to correct for and eliminate the rotational error. The factory interface robot 111 may then place the edge ring 110 into station 104*a* or 104*b* through a vacuum port 103*a*, 103*b* with the correct orientation. Accordingly, the rotational error of the edge ring 110 may be eliminated using the degrees of freedom of the factory interface robot 111 without use of an aligner station.

In some embodiments, the factory interface robot 111 can correct up to a threshold amount of rotational error of the edge ring 110. For example, one factory interface robot 111 may be able to correct up to a 5 degree rotational error, while other factory interface robots 111 may be able to correct up to a 3 degree rotational error, a 7 degree rotational error, or some other amount of rotational error. In some embodiments, the factory interface robot 111 can correct up to a threshold amount of positional error of the edge ring 110 (e.g., if the edge ring is picked up off center). If the detected rotational error is greater than the threshold amount of rotational error that can be corrected by the factory interface robot 111, then the factory interface robot 111 may place the edge ring 110 at a station (not shown), reposition the end effector, and then pick back up the edge ring 110 in a manner that either eliminates the rotational error or reduces the rotational error so that it is less than or equal to the threshold amount of rotational error that can be corrected based on rotation of the end effector. Similarly, if the detected positional error is greater than a threshold amount of positional error of the edge ring 110 than can be corrected without use of a station, then the factory interface robot 111 may place the edge ring 110 at a station, reposition the end effector, and then pick back up the edge ring 110 in a manner that either eliminates the positional error or reduces the positional error so that it is less than or equal to the threshold amount of positional error that can be corrected based on repositioning the end effector. Additionally, both rotational error and positional error may be corrected together (e.g., by rotating and/or repositioning the end effector and/or by placing the edge ring at a station and then picking it back up with a repositioned and/or rotated end effector). In some embodiments, the residual rotational error of the edge ring (which may be 0) after the factory interface robot 111 picks back up the edge ring 110 from the station is known (e.g., based on the known orientation at which the edge ring 110 was placed at the station and the known orientation of the end effector picking up the edge ring 110). Alternatively, the edge ring 110 may again be placed within the detection area 135*a* of the non-contact sensor 130*a*, and further sensor data may be generated. A new determination of rotational error of the edge ring 110 may then be determined from the further sensor data, and further angular correction of the edge ring 110 may be performed as described above. The edge ring 110 may then be placed in the station 104*a*, 104*b* without rotational error and/or without positional error (also referred to as translational error).

A transfer chamber robot 112 located in the transfer chamber 106 removes the edge ring 110 from one of the stations 104*a*, 104*b* through a second vacuum port 105*a* or 105*b*. The transfer chamber robot 112 moves the edge ring 110 (which at this point has the correct orientation) into the transfer chamber 106, where the edge ring 110 may be transferred to a destination processing chamber 107 though a respective port 108.

In some embodiments, non-contact sensor 130*a* is not used. Accordingly, factory interface robot 111 may place the edge ring 110 in station 104*a* with some amount of misalignment (e.g., a rotational error and/or a positional error). In such an embodiment, station 104*a* may include non-contact sensor 130*b*, which may generate sensor data of the edge ring 110 (e.g., generate a picture of the edge ring) while the edge ring 110 is at station 104*a*. Transfer station 104*a* may be a load lock or other station with a transparent window at a top of the transfer station 104a. The non-contact sensor 130b may be an image sensor that can generate images of edge rings 110 through the transparent window. In embodiments, the interior of the station 104a may be in vacuum, but the non-contact sensor 104a may not be in vacuum. Controller 109 receives the sensor data and analyzes the sensor data (e.g., performs image processing on a received image of the edge ring 110) to determine a rotational error and/or positional error of the edge ring 110 relative to a target orientation and/or position of the edge ring 110. Controller 109 may determine a rotational error, which may be a rotational angle between the target orientation and a current orientation of the edge ring 110.

The controller 109 may then determine a sequence of pick-ups and placements of the edge ring 104a at station 104a that will eliminate the rotational error and/or the positional error. Traditionally, transfer chamber robot 112 may pick up objects at approximately their center, and objects may be placed at a central location at the station. However, controller 109 may cause transfer chamber robot 112 to pick up the edge ring 110 (optionally off center), change position slightly, drop off the edge ring 110 at the station off center (at a different position than it was picked up from the station 104a), change position slightly, pick up the edge ring 110 (optionally off center) again, and so on. With each sequence of picking up, repositioning, and replacing the edge ring 110 at the station 104a, a rotation or yaw of the edge ring may be adjusted slightly. Additionally, a position of the edge ring may be adjusted slightly. Accordingly, a sequence of pick-ups and drop offs may be performed to correct a detected rotational error and/or positional error. Once the rotational error is corrected and/or the positional error is corrected, transfer chamber robot 112 removes the edge ring 110 from station 104a through a second vacuum port 105a. The transfer chamber robot 112 moves the edge ring 110 (which at this point has the correct orientation) into the transfer chamber 106, where the edge ring 110 may be transferred to a desired processing chamber 107 though a respective port 108.

While not shown for clarity in FIG. 1, transfer of the edge ring 110 may occur while the edge ring 110 is positioned on a carrier or adapter, and the end effectors may pick up and place the carrier or adapter that holds the edge ring 110. This may enable an end effector that is configured for handling of wafers to be used to also handle the edge ring 110.

FIG. 1 illustrates one example of edge ring transfer, however, other examples are also contemplated. For example, edge rings may be loaded in a substrate support pedestal (SSP). An additional SSP may be positioned in communication with the factory interface 101 opposite the illustrated SSP.

It is contemplated that a processed edge ring 110 may be removed from the processing system 100 in reverse of any manner described herein. For such a process, a carrier designed to hold edge ring 110 may be removed from a cassette 102 by factory interface robot 111. The factory interface robot 110 may position the empty carrier within the area of detection 135b of non-contact sensor 130a. Sensor data may then be generated, and controller 109 may analyze the sensor data to determine an orientation of the carrier and to determine whether the carrier has any rotational error and/or positional error. If the carrier has rotational error, then the rotational error may be corrected as described above. Similarly, if the carrier has positional error, then the positional error may be corrected as described above. The carrier with the corrected orientation and/or position may then be placed at station 104a, 104b and removed by transfer chamber robot 110 for insertion into a processing chamber 107. A used edge ring 110 may then be placed on the carrier, which may then be transferred back through station 104a, 104b and into a cassette 102 via handling by transfer chamber robot 112 and factory interface robot 111.

Additionally, or alternatively, the carrier may be placed in station 104a without having undergone a correction in its orientation and/or position. In such an embodiment, non-contact sensor 130b may be used to determine any rotational error and/or positional error in the carrier, which may than be corrected in the manner described above.

When utilizing two SSPs or multiple cassettes 102, it is contemplated that one SSP or cassette 102 may be used for unprocessed edge rings 110, while another SSP or cassette 102 may be used for receiving processed edge rings 110.

Figure 2:
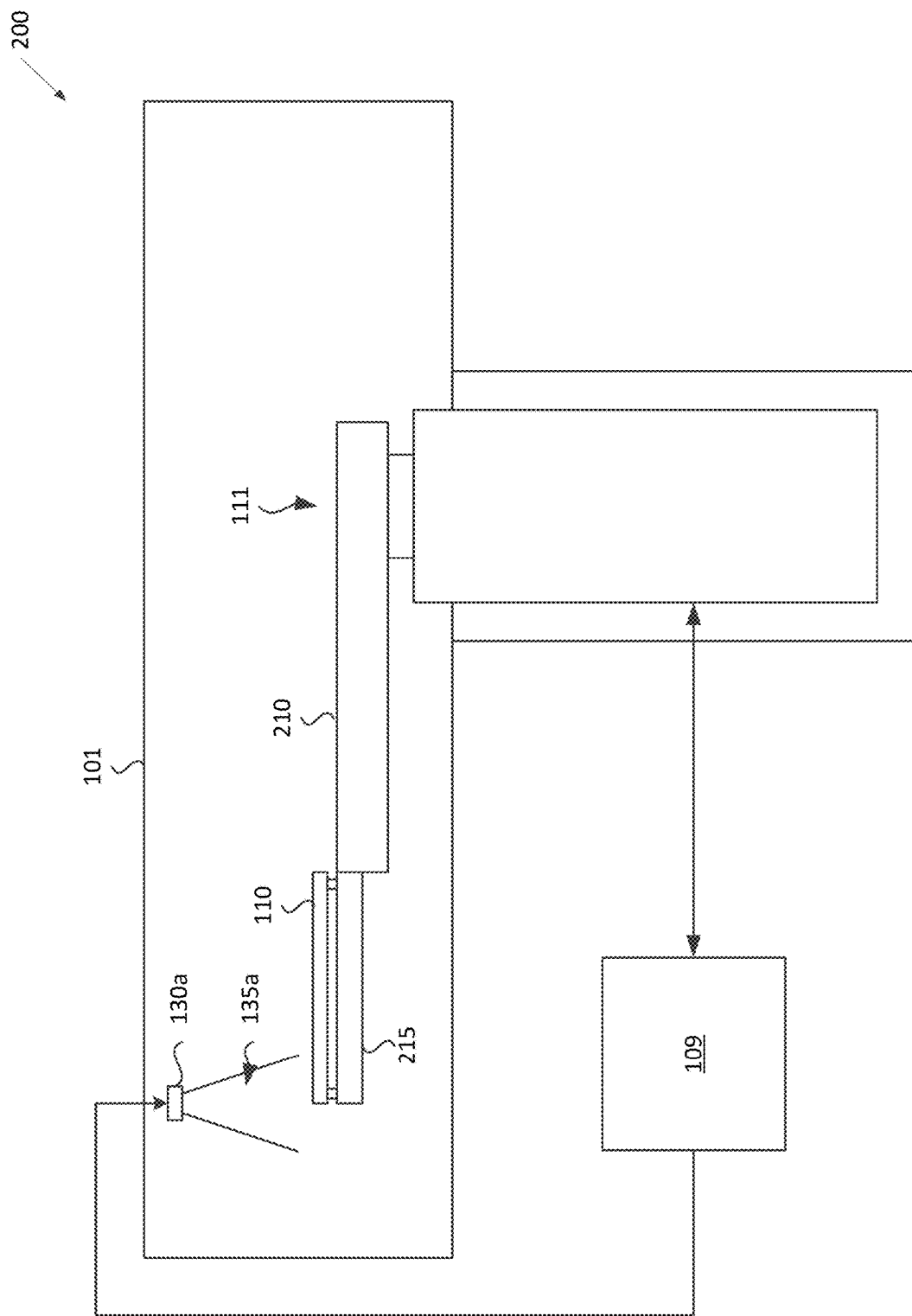
FIG. 2 depicts a simplified side view of a portion of the processing system, according to one aspect of the disclosure.

FIG. 2 depicts a simplified side view of a portion 200 of the processing system 100, according to one aspect of the disclosure. In particular, portion 200 of the processing system 100 includes factory interface 101 and controller 109. As shown, factory interface robot 111 includes a robot arm 210 having an end effector (also known as a robot blade) 215 at an end of the robot arm 210. Supported on the end effector 215 is an edge ring 110. The controller 109 causes the factory interface robot 111 to position the edge ring 110 under the non-contact sensor 130a in the detection area 135a of the non-contact sensor 130a. The non-contact sensor 130a may then generate sensor data (e.g., one or more images), and send the images to controller 109 for processing as described above with reference to FIG. 1.

FIGS. 1-2 have been described with reference to correction of a rotational error and/or positional error of an edge ring 110. However, it should be understood that the same system and techniques described with reference to edge rings may also be used to detect and correct rotational error and/or positional error of other objects, such as wafers, display panels, consumable parts for processing chambers, masks, and so on.

Figure 3B:
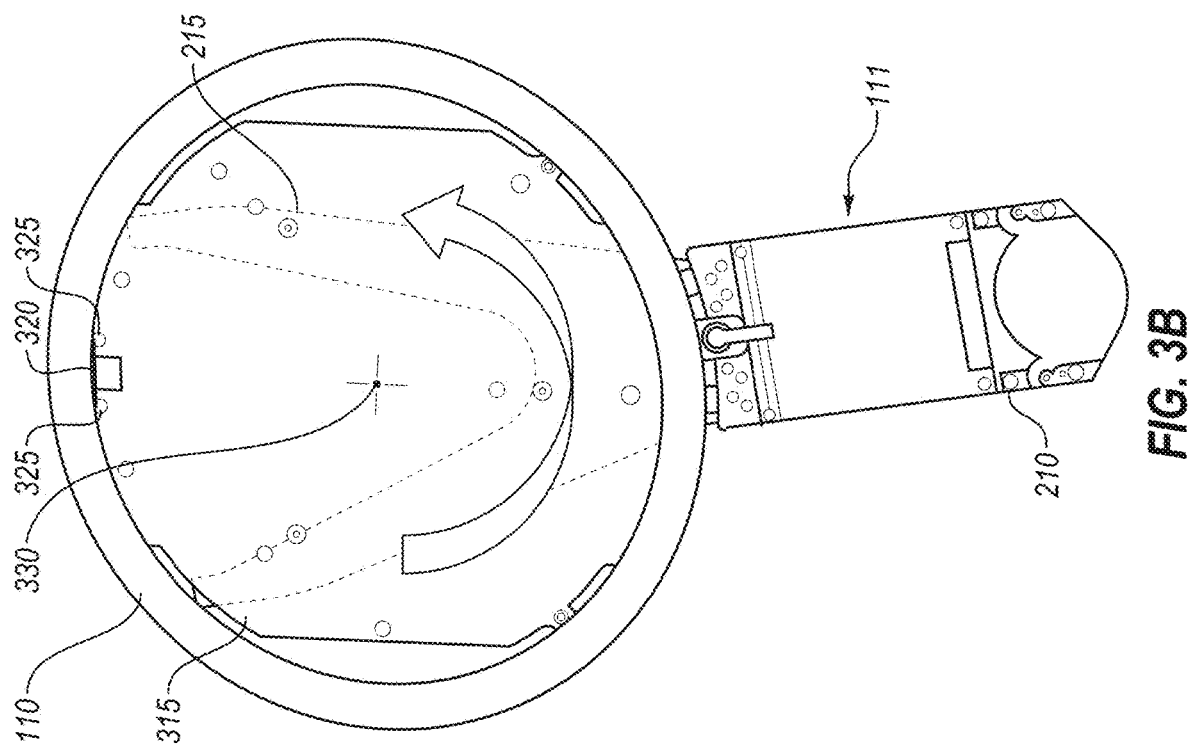
FIG. 3B illustrates a top view of the object and end effector of FIG. 3A, where the end effector has been rotated about an end effector axis to correct the misalignment of the object, according to one aspect of the disclosure.
Figure 3A:
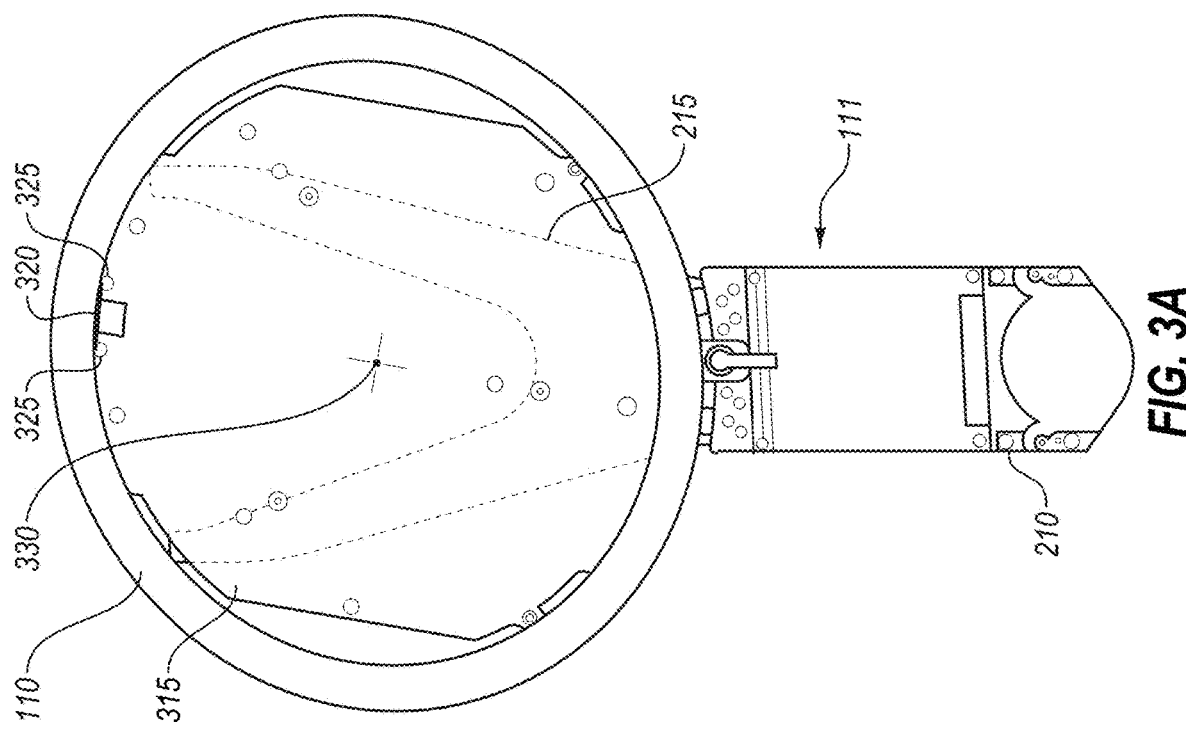
FIG. 3A illustrates a top view of a misaligned object on an end effector, according to one aspect of the disclosure.

FIG. 3A illustrates a top view of a misaligned object on an end effector 215 of a robot arm 210, according to one aspect of the disclosure. The misaligned object may be an edge ring 110, as discussed above. However, the misaligned object may alternatively be a display panel, a photolithography mask, a wafer (e.g., a semiconductor wafer or silicon wafer), or other object with a target orientation. Typically, the object will be a relatively flat object with a height that is orders of magnitude smaller than a diameter, length and/or width.

As shown, the edge ring 110 has a registration feature 320, which in the illustrated embodiment is a flat on an inner edge of the edge ring 110. However, other types of registration features may also be used, such as flats at other locations of the edge ring (or other object), fiducials in the edge ring (or other object), one or more notches in the edge ring (or other object), and so on. As also shown, the registration feature 320 is rotated relative to a front of the end effector 215, indicating that the edge ring 110 has been placed incorrectly on the end effector 215 such that a rotational error is introduced. The factory interface robot 111 may have sufficient degrees of freedom to rotate the end effector 215 (and the edge ring 110 held on the end effector 215) about an end effector axis 330. The end effector axis 330 may be an axis (e.g., a vertical axis) that corresponds approximately to a center of the edge ring 110 supported by the end effector 215. Accordingly, the end effector 215 and edge ring 110 may be effectively rotated optionally without introducing a translational movement (e.g., left, right, front, or back) to the edge ring 110.

FIG. 3B illustrates a top view of the object and end effector 215 of FIG. 3A, where the end effector 215 and edge ring 110 have been rotated about the end effector axis 330 to correct the misalignment of the edge ring 110, according to one aspect of the disclosure. The rotation may be performed after generating sensor data (e.g., image data) using a non-contact sensor such as a camera and then processing the sensor data to determine a rotational error of the edge ring 110.

In some embodiments, edge ring 110 may be supported by a carrier 315. Carrier 315 may be designed to interface both with end effector 215 and with edge ring 110 and to enable end effector 215 to carry edge ring 110. As shown, carrier 315 includes pins 325 that are used to secure edge ring 110. The pins 325 may also act as registration features for carrier 315. Accordingly, a non-contact sensor as described above may generate sensor data of carrier 315 to determine an orientation (and possibly a rotational error) of the carrier 315. The rotational error of the carrier 315 may be eliminated in the same manner as described above for the edge ring 110.

As discussed above, the edge ring 110 may have a target orientation relative to the end effector 215. Additionally, the edge ring 110 may also have a target orientation relative to the carrier 315. Specifically, in some embodiments a target orientation of the edge ring 110 is to have the flat (registration feature 320) of the edge ring line up with the pins (registration feature 325) of the carrier 315. In some embodiments, the orientation of the edge ring 110 may not be aligned with the orientation of the carrier 315. The sensor data from the non-contact sensor may be used to determine both the orientation of the edge ring 110 and the orientation of the carrier 315. A difference between these two orientations (e.g., rotational angles) may then be determined by the controller 109. If the difference exceeds a threshold, then controller 109 may determine that the edge ring 110 and carrier 315 are not to be used, and the carrier and adapter may be placed back at their starting location (e.g., back into a FOUP). In some embodiments, if there is a first rotational error of the edge ring 110 relative to the end effector 215 and a second rotational error of the carrier 315 relative to the end effector 215, then the angular correction that is performed removes the first rotational error rather than the second rotational error.

FIG. 4-7 are flow diagrams of various embodiments of methods 400-700 for correcting misalignment of an object on an end effector of a robot arm. The methods are performed by processing logic that may include hardware (circuitry, dedicated logic, etc.), software (such as is run on a general purpose computer system or a dedicated machine), firmware, or some combination thereof. Some methods 400-600 may be performed by a computing device, such as controller 109 of FIGS. 1-2 that is in control of a robot arm and/or a non-contact sensor. For example, processing logic that performs one or more operations of methods 400-600 may execute on controller 109.

For simplicity of explanation, the methods are depicted and described as a series of acts. However, acts in accordance with this disclosure can occur in various orders and/or concurrently, and with other acts not presented and described herein. Furthermore, not all illustrated acts may be performed to implement the methods in accordance with the disclosed subject matter. In addition, those skilled in the art will understand and appreciate that the methods could alternatively be represented as a series of interrelated states via a state diagram or events.

Figure 4:
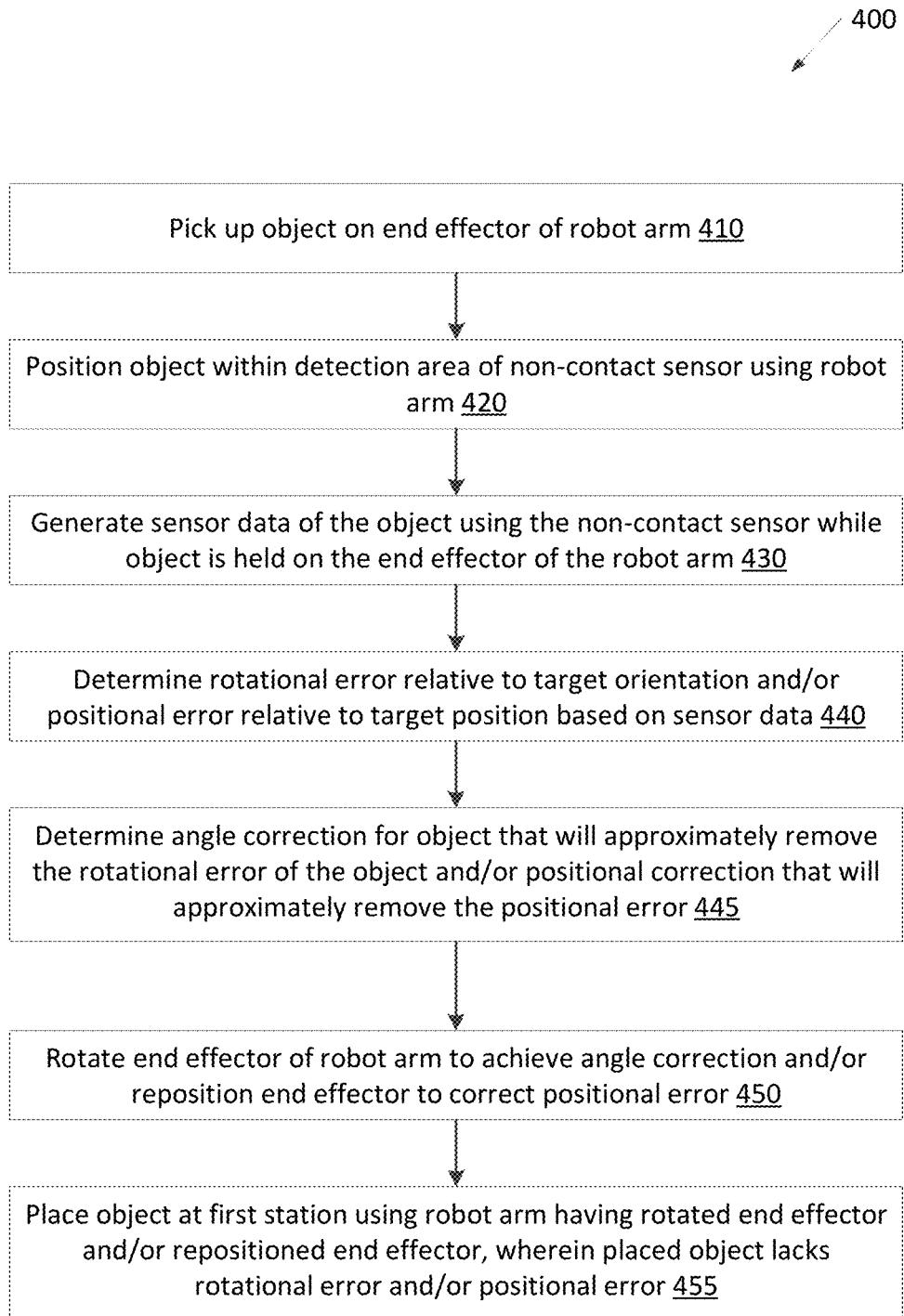
FIG. 4 illustrates a method for correcting misalignment of an object on an end effector of a robot arm, according to one aspect of the disclosure.

FIG. 4 illustrates a method 400 for correcting misalignment of an object on an end effector of a robot arm, according to one aspect of the disclosure. At block 410 of method 400, a robot arm picks up an object on an end effector of the robot arm (e.g., based on instructions from a computing device). The object may be any of the aforementioned objects, such as a process kit ring. For example, the object may be a process kit ring that includes a registration feature that is a flat, where the flat should have a proper orientation so as to fit into and mate with a corresponding flat on a substrate support assembly onto which the process kit ring will be placed.

At block 420, the robot arm positions the object within the detection area of a non-contact sensor. For example, the non-contact sensor may be a camera, and the robot arm may position the object within a field of view of the camera.

At block 430, the non-contact sensor generates sensor data of the object while the object is held on the end effector of the robot arm (e.g., based on instructions from a computing device).

At block 440, processing logic determines a rotational error of the object relative to a target orientation of the object and/or determines a positional error of the object relative to a target position of the object based on the sensor data. The target orientation may be a target orientation relative to an orientation of the end effector. Similarly, the target position may be a target position relative to the end effector.

In some embodiments, the sensor is a camera and the sensor data comprises one or more images of the object on the end effector. In such an embodiment, the rotational error and/or positional error of the object may be determined by performing image processing on the one or more images. For example, the object may have a known shape and/or may include one or more registration features (e.g., a flat, a notch, a fiducial, etc.). The image processing may be performed to determine a position and/or orientation of the one or more registration features. The position and orientation of the end effector may be known to a high certainty using, for example, encoders and/or sensors in the robotic arm to which the end effector is affixed. Accordingly, the determined position and/or orientation of the object relative to the position and/or orientation of the end effector can be determined.

In one embodiment, a Hough transform is performed to determine the rotational error of the object. Using the Hough transform and a prior knowledge of a shape of the object (e.g., a flat on the object), processing logic can determine the location and orientation of the flat. Other standard image processing techniques may also be used to determine the orientation of the object, such as edge detection, slope calculation, voting algorithms, the oriented FAST and rotated BRIEF (ORB) image processing technique, and so on.

At block 445, processing logic determines an angle correction for the object that will approximately or completely remove the rotational error of the object. At block 450, processing logic causes the robot arm be repositioned to rotate the end effector and achieve the angle correction and/or correct the positional error. The end effector may be effectively rotated about an end effector axis in embodiments.

At block 455, processing logic causes the robot arm to place the object at a first station (e.g., a transfer station or load lock) using the robot arm having the rotated and/or repositioned end effector. The placed object lacks the rotational error and/or the positional error. The correction in the angular error and/or the positional error may be performed using the degrees of freedom of the robot arm and without the use of an aligner. In some embodiments, the operations of block 450 and the operations of block 455 are performed together such that the rotation and/or repositioning of the end effector is completed as the object is moved to the first station. For example, the end effector may be rotated slightly while it places the object at the first station to provide the determined angle correction for the object.

Method 400 may improve an accuracy of the orientation (e.g., rotation or yaw) of objects such as edge rings as compared to traditional techniques for eliminating rotational error such as the use of aligners. Additionally, method 400 may be used to determine and correct rotational error for many different types of objects that may not fit into an aligner station. Method 400 enables an aligner station to be eliminated from a processing system (e.g., a wafer handling system). As discussed above, elimination of an aligner station also has other benefits.

Figure 5:
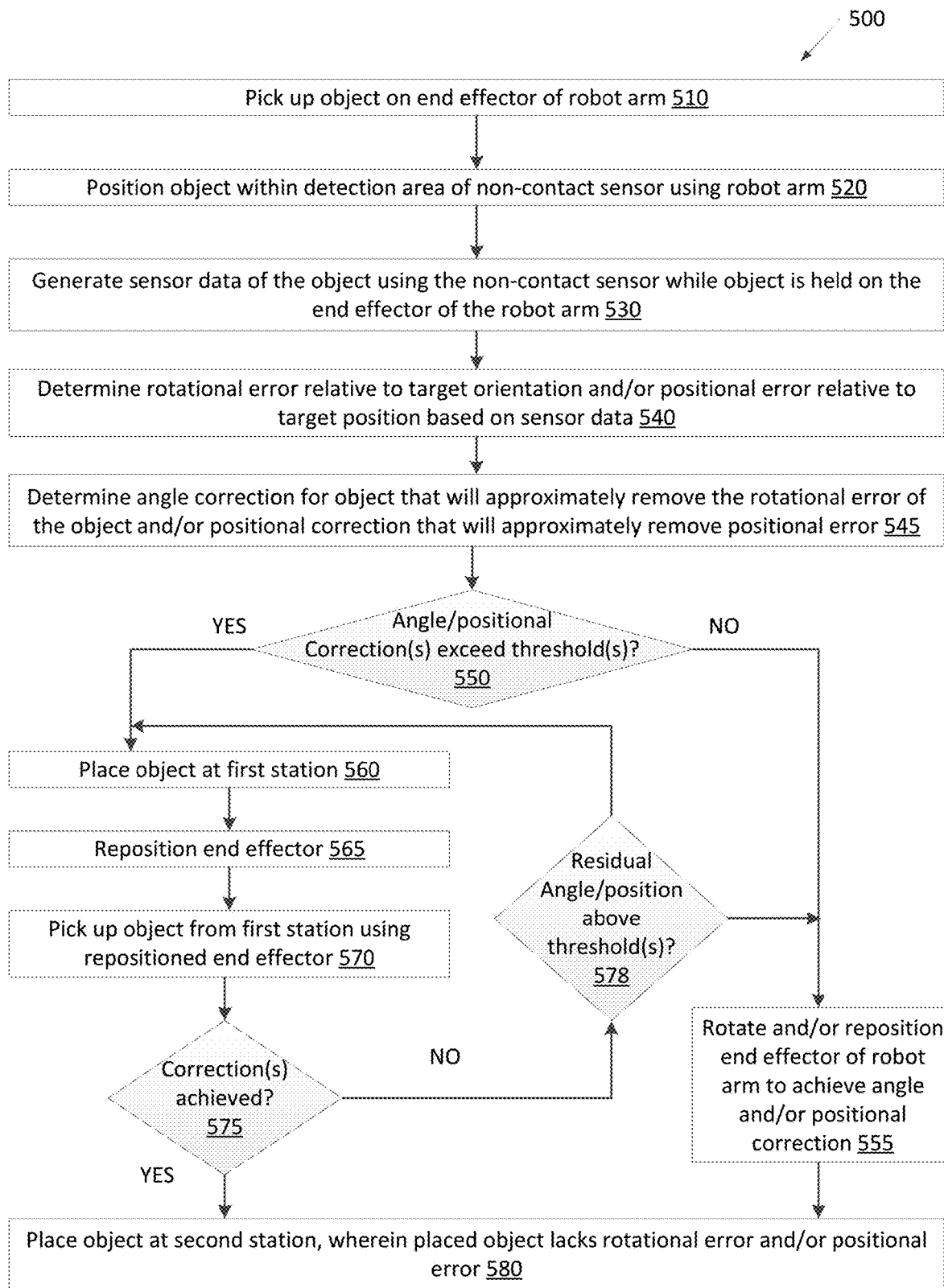
FIG. 5 illustrates an additional method for correcting misalignment of an object on an end effector of a robot arm, according to one aspect of the disclosure.

FIG. 5 illustrates an additional method 500 for correcting misalignment of an object on an end effector of a robot arm, according to one aspect of the disclosure. At block 510 of method 500, a robot arm picks up an object on an end effector of the robot arm (e.g., based on instructions from a computing device). The object may be any of the aforementioned objects, such as a process kit ring. At block 520, the robot arm positions the object within the detection area of a non-contact sensor. For example, the non-contact sensor may be a camera, and the robot arm may position the object within a field of view of the camera.

At block 530, the non-contact sensor generates sensor data of the object while the object is held on the end effector of the robot arm (e.g., based on instructions from a computing device). At block 540, processing logic determines a rotational error of the object relative to a target orientation of the object and/or determines a positional error of the object relative to a target position of the object on the end effector. The target orientation may be a target orientation relative to an orientation of the end effector.

In some embodiments, the sensor is a camera and the sensor data comprises one or more images of the object on the end effector. In such an embodiment, the rotational error of the object may be determined by performing image processing on the one or more images. For example, the object may have a known shape and/or may include one or more registration features (e.g., a flat, a notch, a fiducial, etc.). The image processing may be performed to determine an orientation of the one or more registration features and/or a position of the one or more registration features. The position and orientation of the end effector may be known to a high certainty using, for example, encoders and/or sensors in the robotic arm to which the end effector is affixed. Accordingly, the determined orientation and/or position of the object relative to the orientation and/or position of the end effector can be determined.

In one embodiment, a Hough transform is performed to determine the rotational error of the object. Using the Hough transform and a prior knowledge of a shape of the object (e.g., a flat on the object), processing logic can determine the location and orientation of the flat. Other standard image processing techniques may also be used to determine the orientation of the object, such as edge detection, slope calculation, voting algorithms, the oriented FAST and rotated BRIEF (ORB) image processing technique, and so on.

At block 545, processing logic determines an angle correction for the object that will approximately or completely remove the rotational error of the object and/or a positional correction that will approximately or completely remove the positional error of the object. At block 550, processing logic determines whether the angle correction exceeds a first threshold and/or whether the positional correction exceeds a second threshold. The first threshold may be based on an amount of rotation that can be performed about an end effector axis when the end effector axis is positioned at a station at which the end effector is to drop off the object. Some example thresholds are 3 degrees, 4 degrees, 5 degrees, 6 degrees, 7 degrees, and so on. If the determined angle correction (which corresponds to the rotational error) exceeds the first threshold, the method may proceed to block 560. Similarly, if the positional correction exceeds the second threshold, the method may proceed to block 560. If the determined angle correction is less than or equal to the first threshold (and optionally if the positional correction is less than or equal to the second threshold), the method may continue to block 555.

At block 560, processing logic causes the robot arm to place the object at a first station. At block 565, the robot arm (and end effector) are repositioned. The end effector may be repositioned in a manner that will cause the rotational error and/or positional error to be reduced or eliminated once it picks back up the object. At block 570, the robot arm picks up the object from the first station using the repositioned end effector.

At block 575, processing logic may determine whether the computed angle correction has been achieved (such that the rotational error is eliminated) and/or whether the computed positional correction has been achieved. If the angle correction is achieved and/or the positional correction is achieved, then the method continues to block 575. If there is residual rotational error and/or residual positional error, then the method continues to block 578.

At block 578, processing logic determines whether the residual rotational error is less than or equal to the first threshold and/or whether the residual positional error is less than or equal to the second threshold. If the residual rotational error is above the first threshold, the method returns to block 560. If the residual error is less than or equal to the first threshold, then it can be corrected using the degrees of freedom of the robot arm, and the method proceeds to block 555. Similar determinations can be made for the residual positional error.

At block 555, processing logic causes the robot arm be repositioned to rotate the end effector and achieve the angle correction and/or correct the positional error. The end effector may be effectively rotated about an end effector axis in embodiments.

At block 580, processing logic causes the robot arm to place the object at a second station (e.g., a transfer station or load lock). The placed object lacks the rotational error. The correction in the angular error may be performed without the use of an aligner.

Figure 6:
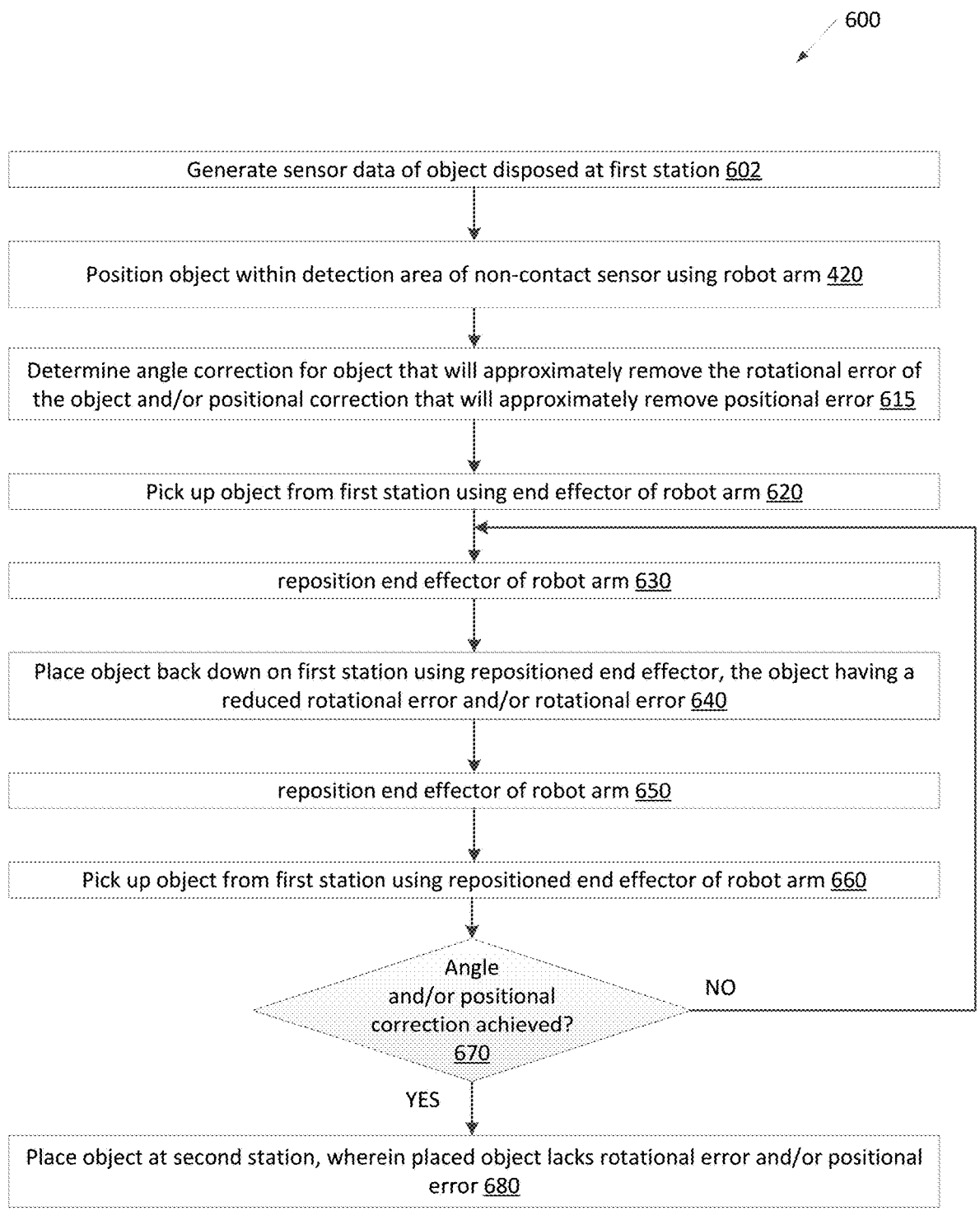
FIG. 6 illustrates an additional method for correcting misalignment of an object on an end effector of a robot arm, according to one aspect of the disclosure.

FIG. 6 illustrates an additional method 600 for correcting misalignment of an object on an end effector of a robot arm, according to one aspect of the disclosure. At block 602 of method 600, sensor data of an object disposed at a first station is generated using a non-contact sensor (e.g., a camera). At block 605, processing logic determines a rotational error of the object relative to a target orientation of the object based on the sensor data and/or determines a positional error of the object relative to a target position of the object based on the sensor data. At block 615, processing logic determines an angle correction for the object that will approximately remove the rotational error of the object and/or determines a positional correction for the object that will approximately remove the positional error of the object. Determining the angle correction may include determining a number of pick-ups and drop-offs of the object using an end effector, as well as positioning of the end effector for each pick-up and drop-off, that will correct the rotational error. A portion of the angle correction that is achieved for each pick-up and drop-off may be determined. In the aggregate, the multiple pick-ups and drop-offs of the object at the first station may eliminate the rotational error and/or the positional error. In some embodiments, only rotational error is corrected. In other embodiments, only positional error is corrected. In still other embodiments, both angular error and positional error are corrected.

At block 620, a robot arm picks up an object on an end effector of the robot arm (e.g., based on instructions from a computing device). The object may be any of the aforementioned objects, such as a process kit ring. For example, the object may be a process kit ring that includes a registration feature that is a flat, where the flat should have a proper orientation so as to fit into and mate with a corresponding flat on a substrate support assembly onto which the process kit ring will be placed.

At block 630, the robot arm is adjusted to reposition the end effector. At block 640, the object is placed back down at the first station using the repositioned end effector. At this point, the object will have a slightly reduced rotational error and/or a slightly reduced positional error, which may have been computed at block 615.

At block 650, the end effector is again repositioned. At block 660, the object is again picked up from the first station using the repositioned end effector.

At block 670, processing logic determines whether the angle correction has been achieved (to eliminate the rotational error) and/or whether the position correction has been achieved. If the angle correction has not been achieved, the method returns to block 630, and another round of pick-ups and drop-offs is performed. If the angle correction is achieved, the method continues to block 680. Similar determinations may be made for the position correction.

At block 680, processing logic causes the robot arm to place the object at a second station (e.g., in a process chamber) using the robot arm. The placed object lacks the rotational error and/or the positional error. The correction in the rotational error in method 600 may be performed using a robot arm that lacks a degree of freedom to rotate the object about an end effector axis of the robot arm's end effector. However, the repeated pick-ups and placements of the object at the first station provides a virtual degree of freedom to the robot arm, enabling rotational errors that are less than a threshold amount of rotational error to be corrected.

Figure 7:
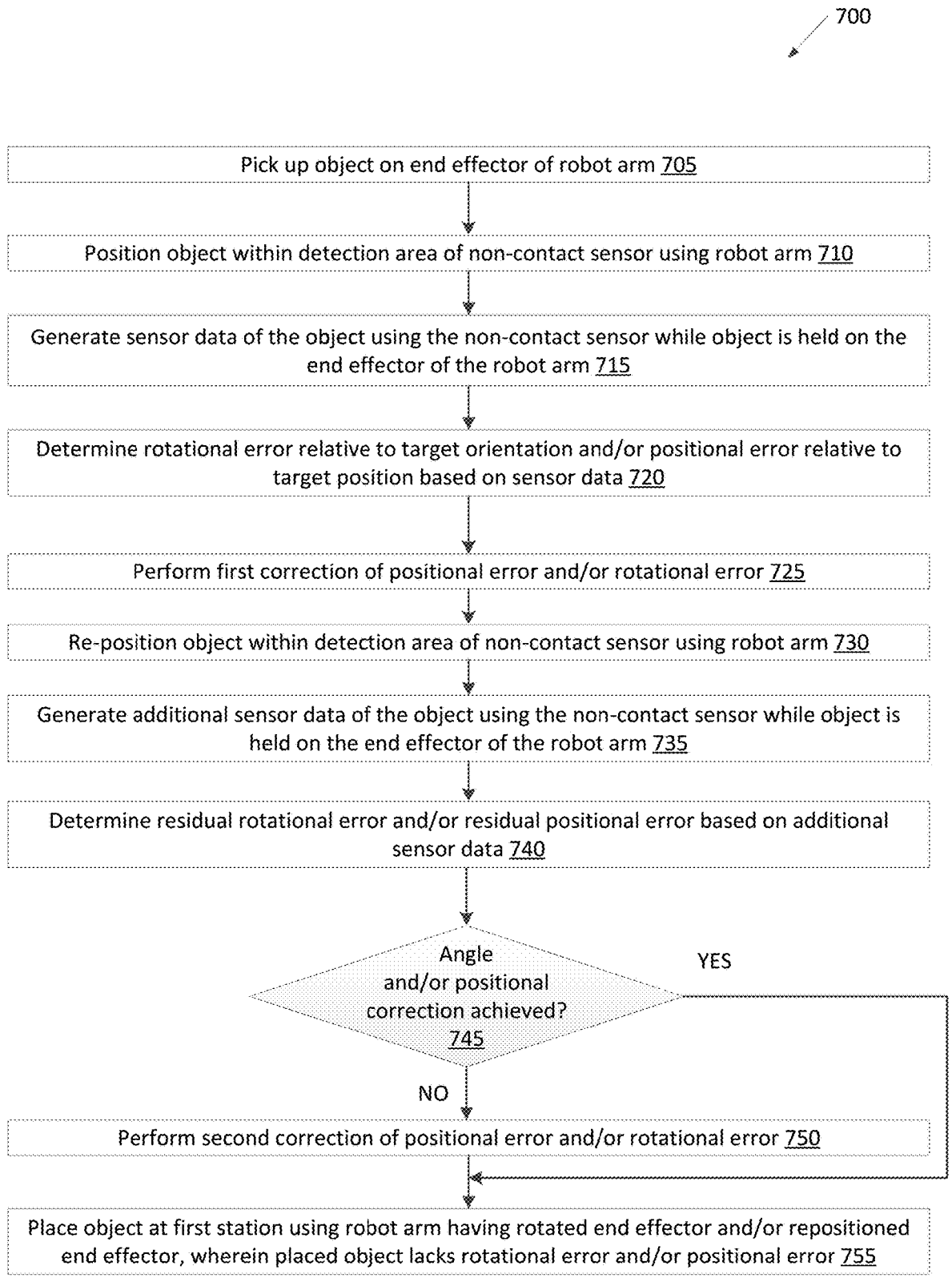
FIG. 7 illustrates an additional method for iteratively correcting misalignment of an object on an end effector of a robot arm, according to one aspect of the disclosure.

FIG. 7 illustrates a method 700 for incrementally correcting misalignment of an object on an end effector of a robot arm, according to one aspect of the disclosure. At block 710 of method 700, a robot arm picks up an object on an end effector of the robot arm (e.g., based on instructions from a computing device). The object may be any of the aforementioned objects, such as a process kit ring. For example, the object may be a process kit ring that includes a registration feature that is a flat, where the flat should have a proper orientation so as to fit into and mate with a corresponding flat on a substrate support assembly onto which the process kit ring will be placed. The robot arm then positions the object within the detection area of a non-contact sensor. For example, the non-contact sensor may be a camera, and the robot arm may position the object within a field of view of the camera.

At block 715, the non-contact sensor generates sensor data of the object while the object is held on the end effector of the robot arm (e.g., based on instructions from a computing device).

At block 720, processing logic determines a rotational error of the object relative to a target orientation of the object and/or determines a positional error of the object relative to a target position of the object based on the sensor data. The target orientation may be a target orientation relative to an orientation of the end effector. Similarly, the target position may be a target position relative to the end effector.

At block 725, processing logic performs a first correction of the positional error and/or the rotational error using one or more of the techniques described above.

At block 730, the robot arm re-positions the object within the detection area of a non-contact sensor. At block 735, the non-contact sensor generates additional sensor data of the object while the object is held on the end effector of the robot arm (e.g., based on instructions from the computing device).

At block 740, processing logic determines a residual rotational error of the object relative to the target orientation of the object and/or determines a residual positional error of the object relative to the target position of the object based on the sensor data. The robot arm may overshoot or undershoot a target amount of correction for the rotation and/or position. For example, the computing device may have directed the robot arm to rotate the held object by 4 degrees, but the robot arm may have actually rotated the held object by only 3.7 degrees. The second sensor data may detect such inaccuracies and identify any residual error.

At block 745, processing logic determines whether the angle correction and/or position correction was achieved to within a threshold level of accuracy (e.g., within 0.1 mm or 0.1 degrees). If the angle and/or positional correction were corrected to within the target level of accuracy, the method may proceed to block 755. If the angle and/or positional correction were not achieved to within the threshold level of accuracy, then the method may continue to block 750.

At block 750, processing logic causes the robot arm to perform a second correction of the residual positional error and/or the residual rotational error. The method may then continue to block 755. Alternatively, the operations of block 740-750 may be repeated one or more additional times. With each iteration of these operations, the amount of residual error will be less, and thus the amount of correction to be performed will be less.

At block 755, processing logic causes the robot arm to place the object at a first station (e.g., a transfer station or load lock) using the robot arm having the rotated and/or repositioned end effector. The placed object lacks the rotational error and/or the positional error. The correction in the angular error and/or the positional error may be performed using the degrees of freedom of the robot arm and without the use of an aligner.

The preceding description sets forth numerous specific details such as examples of specific systems, components, methods, and so forth in order to provide a good understanding of several embodiments of the present disclosure. It will be apparent to one skilled in the art, however, that at least some embodiments of the present disclosure may be practiced without these specific details. In other instances, well-known components or methods are not described in detail or are presented in simple block diagram format in order to avoid unnecessarily obscuring the present disclosure. Thus, the specific details set forth are merely exemplary. Particular implementations may vary from these exemplary details and still be contemplated to be within the scope of the present disclosure.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±10%.

Although the operations of the methods herein are shown and described in a particular order, the order of operations of each method may be altered so that certain operations may be performed in an inverse order so that certain operations may be performed, at least in part, concurrently with other operations. In another embodiment, instructions or sub-operations of distinct operations may be in an intermittent and/or alternating manner.

It is understood that the above description is intended to be illustrative, and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. A method comprising:
   picking up an object on an end effector of a robot arm;
   generating an image of the object on the end effector using an image sensor while the object is held on the end effector of the robot arm;
   determining at least one of (i) a rotational error of the object based on an orientation of a registration feature reflected by the image of the object or (ii) a positional error of the object based on a position of the registration feature reflected by the image of the object;
   adjusting the robot arm to approximately remove at least one of the rotational error or the positional error; and
   placing the object at a first station using the robot arm without at least one of the rotational error or the positional error.

2. The method of claim 1, wherein the robot arm comprises one or more joints that enable up to a threshold amount of rotation of the end effector about an end effector axis, the method further comprising:
   determining an angle correction for the object that will approximately remove the rotational error of the object;
   wherein adjusting the robot arm to approximately remove the rotational error of the object comprises rotating the end effector of the robot arm to achieve the angle correction, and wherein the placing is performed using the end effector that is rotated to achieve the angle correction.

3. The method of claim 2, further comprising:
   determining that the angle correction is less than or equal to the threshold amount of rotation.

4. The method of claim 1, wherein the robot arm comprises one or more joints that enable up to a threshold amount of rotation of the end effector about an end effector axis, the method further comprising:
   determining an angle correction for the object that will approximately remove the rotational error of the object; and
   determining that the angle correction is greater than the threshold amount of rotation;
   wherein adjusting the robot arm to approximately remove the rotational error from the object comprises performing the following one or more times until a) the angle correction is achieved for the object or b) a residual angular error is less than the threshold amount of rotation of the end effector:
   placing the object at a second station;
   repositioning the end effector; and
   picking up the object from the second station using the repositioned end effector, wherein the object has a lesser rotational error after being picked up from the second station.

5. The method of claim 4, wherein the object has a lesser positional error after being picked up from the second station.

6. The method of claim 1, wherein the robot arm comprises one or more joints that enable up to a threshold amount of rotation of the end effector about an end effector axis, and wherein the robot arm is capable of correcting up to a threshold amount of positional error without use of a second station, the method further comprising:
   determining an angle correction for the object that will approximately remove the rotational error of the object;
   determining a positional correction that will approximately remove the positional error of the object;
   determining that at least one of a) the angle correction is greater than the threshold amount of rotation or b) the positional error is greater than the threshold amount of positional error;
   wherein adjusting the robot arm to approximately remove at least one of the rotational error or the positional error from the object comprises performing the following one or more times:
   placing the object at the second station;
   repositioning the end effector; and
   picking up the object from the second station using the repositioned end effector, wherein the object has at least one of a lesser rotational error or a lesser positional error after being picked up from the second station.

7. The method of claim 1, wherein the robot arm lacks an ability to rotate the end effector about an end effector axis, the method further comprising:
   determining an angle correction for the object that will approximately remove the rotational error of the object;
   wherein adjusting the robot arm to approximately remove the rotational error from the object comprises performing the following one or more times until the angle correction is achieved for the object:
   placing the object at a second station;
   repositioning the end effector; and
   picking up the object from the second station using the repositioned end effector, wherein the object has a lesser rotational error.

8. The method of claim 7, wherein the object has a lesser positional error after being picked up from the second station.

9. The method of claim 1, wherein generating the image of the object comprises generating one or more images using the image sensor, and wherein determining the rotational error of the object comprises performing image processing on the one or more images to identify an orientation of at least one of a flat, a notch or a fiducial in the object.

10. The method of claim 1, wherein the object is attached to a carrier, wherein picking up the object comprises picking up the carrier attached to the object, and wherein placing the object comprises placing the carrier attached to the object, the method further comprising:
generating sensor data of the carrier using the image sensor; and
determining a rotational error of the carrier based on the sensor data of the carrier.

11. The method of claim 10, further comprising:
comparing the rotational error of the carrier to the rotational error of the object;
determining a difference between the rotational error of the carrier and the rotational error of the object based on the comparing;
determining whether the difference exceeds a threshold; and
placing the object at the first station responsive to determining that the difference does not exceed the threshold.

12. The method of claim 1, further comprising:
picking up, from a first location, a carrier attached to a second object on the end effector of the robot arm;
generating new sensor data of the carrier and the object using the image sensor while the carrier is held on the end effector of the robot arm;
determining an orientation of the carrier based on the new sensor data;
determining an orientation of the second object based on the new sensor data;
determining a difference between the orientation of the carrier and the orientation of the object;
determining whether the difference exceeds a threshold; and
placing the carrier and the object back at the first location responsive to determining that the difference exceeds the threshold.

13. The method of claim 1, wherein the object comprises a consumable part for a processing chamber.

14. The method of claim 1, wherein the image sensor comprises a laser emitter that generates a laser beam and a laser receiver that receives the laser beam, wherein generating the image of the object comprises:
repeatedly (a) extending the end effector until the object is between the laser emitter and the laser receiver and interrupts the laser beam, causing the laser beam to no longer be received by the laser receiver, and (b) recording one or more parameters of the robot arm at which the object interrupts the laser beam, the one or more parameters comprising a rotation of the end effector and a position of the end effector;
generating an array of measurements, wherein each measurement corresponds to a different rotation of the end effector; and
determining a rotational angle of the object based on the array of measurements.

15. The method of claim 1, further comprising performing the following after adjusting the robot arm and before placing the object at the first station:
generating an additional image of the object using the image sensor;
determining at least one of a residual rotational error of the object or a residual positional error of the object based on the image; and
further adjusting the robot arm to approximately remove at least one of the residual rotational error or the residual positional error from the object.

16. A robotic object handling system, comprising:
a robot arm comprising an end effector;
an image sensor;
a first station; and
a computing device operatively coupled to the image sensor and the robot arm, wherein the computing device is to:
cause the robot arm to pick up an object on the end effector;
cause the image sensor to generate an image of the object on the end effector while the object is held on the end effector of the robot arm;
determine at least one of (i) a rotational error of the object based on an orientation of a registration feature reflected by the image of the object or (ii) a positional error of the object based on a position of the registration feature reflected by the image of the object;
cause an adjustment to the robot arm to approximately remove at least one of the rotational error or the positional error; and
cause the robot arm to place the object at the first station without at least one of the rotational error or the positional error.

17. The robotic object handling system of claim 16, wherein the robot arm comprises one or more joints that enable up to a threshold amount of rotation of the end effector about an end effector axis, wherein the computing device is further to:
determine an angle correction for the object that will approximately remove the rotational error of the object;
wherein causing the adjustment to the robot arm to approximately remove the rotational error from the object comprises rotating the end effector of the robot arm to achieve the angle correction, and wherein the placing is performed using the end effector that is rotated to achieve the angle correction.

18. The robotic object handling system of claim 17, wherein the computing device is further to:
determine that the angle correction is less than or equal to the threshold amount of rotation.

19. The robotic object handling system of claim 16, wherein the robot arm comprises one or more joints that enable up to a threshold amount of rotation of the end effector about an end effector axis, wherein the computing device is further to:
determine an angle correction for the object that will approximately remove the rotational error of the object; and
determine that the angle correction is greater than the threshold amount of rotation;
wherein causing the adjustment to the robot arm to approximately remove the rotational error from the object comprises performing the following one or more times until a) the angle correction is achieved for the object or b) a residual angular error is less than the threshold amount of rotation of the end effector:
placing the object at a second station, the object having an initial position and orientation on the second station;
repositioning the end effector; and picking up the object from the second station using the repositioned end effector, wherein the object has a lesser rotational error after being picked up from the second station.

20. The robotic object handling system of claim 16, wherein generating the image of the object comprises generating one or more images using the image sensor, and wherein determining the rotational error of the object comprises performing image processing on the one or more images to identify an orientation of at least one of a flat, a notch or a fiducial in the object.

21. The robotic object handling system of claim 16, wherein the object is attached to a carrier, wherein picking up the object comprises picking up the carrier attached to the object, and wherein placing the object comprises placing the carrier attached to the object, wherein the computing device is further to:
generate sensor data of the carrier using the image sensor; and
determine a rotational error of the carrier based on the sensor data of the carrier.

22. The robotic object handling system of claim 21, wherein the computing device is further to:
compare the rotational error of the carrier to the rotational error of the object;
determine a difference between the rotational error of the carrier and the rotational error of the object based on the comparing;
determine whether the difference exceeds a threshold; and
cause the robotic arm to place the object at the first station responsive to determining that the difference does not exceed the threshold.

23. A robotic handling system, comprising:
a robot arm comprising an end effector;
a first station;
a second station;
an image sensor; and
a computing device operatively coupled to the image sensor and the robot arm, wherein the computing device is to:
cause the image sensor to generate an image of an object on the end effector while the object is at the first station;
determine a rotational error of the object based on an orientation of a registration feature reflected by the image of the object;
determine an angle correction for the object that will approximately remove the rotational error;
perform the following one or more times until the angle correction is achieved for the object:
cause the robot arm to pick up the object from the first station;
reposition the end effector;
cause the robot arm to place the object back down on the first station using the repositioned end effector, the object having a reduced rotational error; and
again reposition the end effector;
cause the robot arm to again pick up the object from the first station; and
cause the robot arm to place the object at the second station without the rotational error.

* * * * *